(12) United States Patent
Bez et al.

(10) Patent No.: US 9,425,118 B2
(45) Date of Patent: Aug. 23, 2016

(54) ELECTRONIC COMPONENT HAVING A CORROSION-PROTECTED BONDING CONNECTION AND METHOD FOR PRODUCING THE COMPONENT

(71) Applicant: Robert Bosch GmbH, Stuttgart (DE)

(72) Inventors: Fabian Bez, Kirchentelinsfurt (DE); Johannes Duerr, Reutlingen (DE); Rolf Becker, Pfullingen (DE); Sven Lamers, Reutlingen (DE); Lutz Mueller, Aichtal (DE); Michael Schlecht, Walddorfhaeslach (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 14/370,858

(22) PCT Filed: Nov. 29, 2012

(86) PCT No.: PCT/EP2012/073971
§ 371 (c)(1),
(2) Date: Jul. 7, 2014

(87) PCT Pub. No.: WO2013/104460
PCT Pub. Date: Jul. 18, 2013

(65) Prior Publication Data
US 2015/0137391 A1 May 21, 2015

(30) Foreign Application Priority Data
Jan. 11, 2012 (DE) .................... 10 2012 200 273

(51) Int. Cl.
*H01L 23/48* (2006.01)
*H01L 23/52* (2006.01)
(Continued)

(52) U.S. Cl.
CPC ............... *H01L 23/26* (2013.01); *H01L 21/56* (2013.01); *H01L 23/053* (2013.01);
(Continued)

(58) Field of Classification Search
CPC ........... H01L 2224/73265; H01L 2224/48227; H01L 2224/48247; H01L 2224/45144; H01L 2224/48465; H01L 23/3107; H01L 23/293; H01L 21/56; H01L 23/26; H01L 24/49; H01L 24/85
USPC .......................................... 257/784; 438/126
See application file for complete search history.

(56) References Cited

U.S. PATENT DOCUMENTS

| 4,382,327 | A | 5/1983 | Bardens et al. |
| 2005/0230691 | A1* | 10/2005 | Amiotti et al. .................. 257/79 |

(Continued)

FOREIGN PATENT DOCUMENTS

| DE | 19603746 | 4/1997 |
| DE | 10049556 | 6/2001 |

(Continued)

OTHER PUBLICATIONS

International Search Report for Application No. PCT/EP2012/073971 dated Jan. 30, 2013 (English Translation, 3 pages).

*Primary Examiner* — Thien F Tran
(74) *Attorney, Agent, or Firm* — Michael Best & Friedrich LLP

(57) ABSTRACT

The invention relates to an electronic component (1) having a corrosion-protected bonding connection and a method for producing said component. For this purpose the electronic component (1) has at least one semiconductor chip (3) on a substrate (4). Moreover, a bonding connection at risk of corrosion is provided on the semiconductor chip (3). For encapsulation of the at least one semiconductor chip (3) and the at least one bonding connection at risk of corrosion, said semiconductor chip and bonding connection are surrounded by a hermetically sealing housing (5). The hermetically sealed bonding connection is a bonding wire connection (2) which is fully enclosed in the housing (5), in which the substrate (4) is at least partially enclosed. The substrate (4) has at least one surface-mounted hydrolysis-sensitive component (6) in the housing (5).

8 Claims, 3 Drawing Sheets

(51) Int. Cl.
*H01L 29/40* (2006.01)
*H01L 23/26* (2006.01)
*H01L 23/053* (2006.01)
*H01L 23/00* (2006.01)
*H01L 21/56* (2006.01)
*H01L 23/31* (2006.01)

(52) U.S. Cl.
CPC ............ *H01L 23/3107* (2013.01); *H01L 24/48* (2013.01); *H01L 24/49* (2013.01); *H01L 24/85* (2013.01); *H01L 24/45* (2013.01); *H01L 2224/05624* (2013.01); *H01L 2224/45015* (2013.01); *H01L 2224/45124* (2013.01); *H01L 2224/45144* (2013.01); *H01L 2224/48091* (2013.01); *H01L 2224/48227* (2013.01); *H01L 2224/48453* (2013.01); *H01L 2224/48465* (2013.01); *H01L 2224/48507* (2013.01); *H01L 2224/48599* (2013.01); *H01L 2224/48624* (2013.01); *H01L 2224/48644* (2013.01); *H01L 2224/49* (2013.01); *H01L 2224/73265* (2013.01); *H01L 2224/85* (2013.01); *H01L 2224/85203* (2013.01); *H01L 2924/01327* (2013.01); *H01L 2924/19105* (2013.01)

(56) References Cited

U.S. PATENT DOCUMENTS

2009/0084602 A1* 4/2009 Fukuda et al. ................ 174/520
2012/0106085 A1* 5/2012 Yamazaki et al. ............ 361/705

FOREIGN PATENT DOCUMENTS

| DE | 102008024599 | 12/2009 |
| EP | 0113282 | 7/1984 |
| EP | 2043147 | 4/2009 |
| EP | 2400540 | 12/2011 |
| JP | 59038643 | 3/1984 |
| JP | 2007231453 | 9/2007 |
| JP | 2007305811 | 11/2007 |

* cited by examiner

ELECTRONIC COMPONENT HAVING A CORROSION-PROTECTED BONDING CONNECTION AND METHOD FOR PRODUCING THE COMPONENT

BACKGROUND OF THE INVENTION

The invention relates to an electronic component having a corrosion-protected bonding connection and to a method for producing the same. For this purpose, the electronic component has at least one semiconductor chip on a substrate. Furthermore, a bonding connection at risk of corrosion is provided on the semiconductor chip. As an encapsulation of the at least one semiconductor chip and the at least one bonding connection at risk of corrosion, they are surrounded by a hermetically enclosing package.

The document DE 10 2008 024 599 A1 discloses in this respect packaged active microstructures with direct contacting to a substrate. For this purpose, a microstructured component has active microcomponents, a substrate and semiconductor circuits. Arranged on the substrate is at least one package with one or more active microstructures arranged therein, at least one of the active structures being brought into electrical contact with an electrical conductor track of the substrate through the package surrounding it.

For this purpose, the package consists of a bottom element and a top element, between which the active structures are located, the bottom element being connected to the top element by way of a sealing frame. The bottom element and/or the top element may have depressions, arranged in which there is a getter material, which, when activated, takes up gas molecules in a definable way and thereby changes the gas atmosphere in the package. The getter material may serve the purpose of absorbing moisture or capturing particles. The contact points with respect to the semiconductor circuits may be bonding areas.

The document DE 196 03 746 A1 discloses an electroluminescent layer system, which has within the layer system a getter layer of a getter metal or of a hygroscopic polymer. The hygroscopic polymer has a mixture of a binder polymer and a powdered hygroscopic substance. The getter layer ensures that no residues of oxygen and/or water can get to the electroluminescent layer system.

The conditions in the case of an electronic component that has an interior space or cavity in a package in which unencapsulated semiconductor components are arranged on a substrate and in which bonding wire connections on a semiconductor chip are exposed to the atmosphere of this interior space or cavity are not comparable with a densely packed layer system, in particular if the hermetically closed-off package is intended to provide protection for gold-aluminum thin-wire bonding connections, which are neither present nor to be protected in the layer system.

On the other hand, it is known that, when silicones are used inside a hermetically enclosing package, at relatively high temperatures water can be produced if precautions involving protective gas are not taken. In combination with extremely small amounts of halides, the water can form an electrolyte, which contributes to the corrosion of gold-aluminum phases in gold-aluminum thin-wire bonding connections, and can consequently lead to the premature failure of such bonding wire connections, which reduces the service life of the electronic component. In such cases, hermetically closed-off electronic packages are also filled in a gastight manner with protective gas in the form of helium or nitrogen, in order to slow down the corrosion process, and consequently increase the service life of such electronic components.

In addition, layers of getter metal may be provided in hermetic packages for the adsorption of reactive gases, suitable getter metals such as for example calcium, lithium or strontium being known from the document DE 196 03 746 A1. Such getter materials themselves or the provision thereof in getter layers by vapor deposition, sputtering or thermal activation are relatively expensive and are also relatively complicated to handle. A further alternative for providing corrosion-protected bonding connections is to apply noble-metal-containing protective layers to the aluminum metal alloys of the semiconductor chip.

SUMMARY OF THE INVENTION

According to the invention, an electronic component having a corrosion-protected bonding connection and a method for producing the same are provided. For this purpose, the electronic component has at least one semiconductor chip on a substrate. Furthermore, a bonding connection at risk of corrosion is provided on the semiconductor chip. As an encapsulation of the at least one semiconductor chip and the at least one bonding connection at risk of corrosion, they are surrounded by a hermetically enclosing package. The hermetically enclosed bonding connection is a bonding wire connection, which is completely enclosed in the package, and the substrate is at least partially enclosed in the package. The substrate has in the package at least one surface-mounted hydrolysis-sensitive component.

The introduction of a hydrolysis-sensitive component allows the water content in the gas atmosphere of the hermetically closed package to be reduced by hydrolysis of a hydrolysis-sensitive material of the hydrolysis-sensitive component to the extent that water is no longer available for the formation of electrolytes in a sufficient amount for corrosion of the bonding wire connections at risk of corrosion.

In a further embodiment of the invention, the hydrolysis-sensitive component has an upper side, an underside and a peripheral surface arranged between the upper side and the underside, the underside of the hydrolysis-sensitive component having at least one surface-mountable molecular layer. This surface-mountable molecular layer may be a component part of an adhesive or be a molecular layer of the hydrolysis-sensitive material of the hydrolysis-sensitive component.

It is also provided that the hydrolysis-sensitive component has a hydrolysis-sensitive core material that getters water molecules of an atmosphere of an interior space of the package. The core material of the hydrolysis-sensitive component may additionally have a semipermeable coating, at least on the upper side and the peripheral surface of the hydrolysis-sensitive component. The semipermeable coating supports the form of the hydrolysis-sensitive component and is permeable to water molecules.

In a further embodiment of the invention, it is provided that the hydrolysis-sensitive component comprises a hydrolysis-sensitive plastic. The hydrolysis-sensitive plastic may be a hydrolysis-sensitive polymer, which in its hydrolysis extracts water molecules from the interior space of the package. In this case, the hydrolysis-sensitive plastic is exposed to intensive saponification by the hydrolysis when a glass transition temperature of the plastic is exceeded. A saponification by hydrolysis is the inverse reaction of an esterification of a plastic, so that a hydrolysis-sensitive polyester, which may preferably comprise a hydrolysis-sensitive polybutylene terephthalate, may be provided as the plastic.

A method for producing an electronic component having at least one corrosion-protected bonding connection comprises the following method steps. Firstly, at least one semiconductor chip is produced. This semiconductor chip is applied to a substrate. Then, at least one bonding wire connection is established between the at least one semiconductor chip and the substrate. Furthermore, a surface mounting of at least one component with a hydrolysis-sensitive material is carried out on the substrate. After that, a hermetic encapsulation of the at least one semiconductor chip, the at least one bonding wire connection, the at least one component with the hydrolysis-sensitive material and at least partially the substrate in a package may be carried out. Finally, the heat treatment of the electronic component is performed at a temperature above a glass transition temperature of the hydrolysis-sensitive material, with gettering of water molecules of an atmosphere of an interior space of the package. This heat treatment may also be performed during the operation of the component if the surrounding temperatures of the location where the component is used lie above the glass transition temperature of the hydrolysis-sensitive material, such as for example in an engine compartment of a motor vehicle.

The application of the at least one semiconductor chip to a substrate may also be accompanied at the same time by the application of the at least one component with the hydrolysis-sensitive material, if both are to be performed by way of a material bonding, for example by a layer of adhesive, on the substrate. If the leads are also to be brought to the electronic component by way of lead-throughs through the package, the substrate may be not just partially but completely housed in the hermetically closed package. In this case, the hermetically closed package may be made up of a lower package part and a package cover, with a gastight connecting element arranged inbetween.

Such an electronic component has the associated advantage of providing corrosion protection for the corrosion-sensitive bonding wire connections, which on the one hand connect gold alloy wires to gold-coated contact areas, of for example copper conductor tracks on the substrate, and on the other hand establish bonding connections of the gold alloy wire arranged on the semiconductor chip to aluminum contact areas on the semiconductor chip. This corrosion protection is achieved in an advantageous way by the atmosphere in the hermetically closed package being depleted of water molecules by the electrolysis-sensitive component arranged on the substrate in such a way that halide residues in the atmosphere of the closed package can no longer form corrosive electrolytes.

It is consequently possible to dispense entirely with filling the hermetically closed package with expensive noble gases or inert gases. Furthermore, the production of the component is simplified, since all that is required is to fix the surface-mountable electrolysis-sensitive component provided according to the invention on the substrate. The semipermeable coating on the upper side and the peripheral surface of the electrolysis-sensitive component additionally has the advantage that the substance produced by a saponification of the esterifications of a polyester, such as polybutylene terephthalate, remains restricted to the volume of the hydrolysis-sensitive component and cannot spread in the interior space of the package. The provision of an adhesive molecular layer, for example a layer of adhesive, for the surface mounting of the hydrolysis-sensitive component, has the advantage that permanent fixing of the saponified substance produced remains restricted to the size of the layer of adhesive.

In particular, the component has the advantage that the lifetime of the gold-aluminum connection of the bonding wire connection on the semiconductor chip can be improved by a power of 10, with at the same time reduced effort for corrosion protection.

BRIEF DESCRIPTION OF THE DRAWINGS

Further aspects and advantages of the invention are now described in more detail on the basis of the accompanying figures, in which.

DETAILED DESCRIPTION

Figure 1:
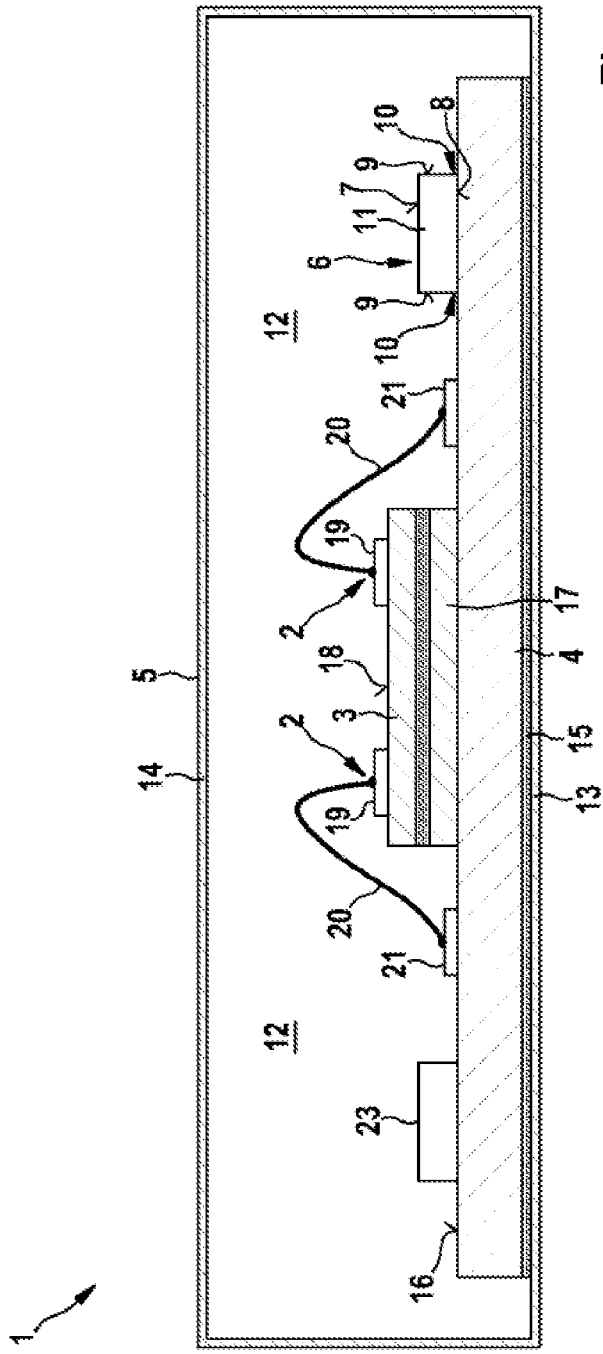
FIG. 1 shows a schematic representation of an electronic component according to one embodiment of the invention.

The schematic representation shown in FIG. 1 of an electronic component 1 according to one embodiment of the invention shows a closed package 5 with a bottom region 13 and a covering region 14, the bottom region 13 being joined to the covering region 14 in such a way that a hermetically closed interior space 12 is obtained in the package 5. A substrate 4 of a ceramic substance is fixed on the bottom region 13 with the aid of a layer of heat-conducting silicone adhesive 15. It is known of such layers of silicone adhesive 15 that, at temperatures above room temperature, they can emit water molecules into the atmosphere of the interior space 12. On an upper side 16 of the substrate 4, an unpackaged semiconductor chip 3 is fixed in an electrically conducting manner with the aid of an epoxy adhesive 17 filled with silver-containing filler particles.

Arranged on an upper side 18 of the semiconductor chip 3 are aluminum bonding areas 19 of an aluminum alloy containing for example 4% by weight of silicon, on which a gold bonding wire connection 2 is bonded by thermocompression. From the bonding wire connection 2 there extends a gold bonding wire 20, which has a diameter of between 12 μm and 50 μm and is fixed by a second end on a bonding area 21 with gold metallization of a copper conductor track on the upper side 16 of the substrate 4. The bonding wire connection 2 on the semiconductor chip 3 is at risk of corrosion if, in addition to a source emitting water molecules, there is within the package also a disruptive source 23 emitting halides, so that corrosion-causing electrolytes can form. In order to protect the bonding wire connection 2 from such corrosion, a surface-mountable electrolysis-sensitive component 6, which has an upper side 7 and a surface-mountable underside 8, is arranged on the upper side 16 of the substrate 4.

Arranged between the upper side 7 and the underside 8 is a peripheral surface 9. For surface mounting, at least one molecular layer 10 is provided, connecting the hydrolysis-sensitive component 6 to the upper side 16 of the substrate 4 by a material bond. The hydrolysis-sensitive component 6 has a core material 11 of a hydrolysis-sensitive material, which in this embodiment of the invention is a polyester in the form of a polybutylene terephthalate, which saponifies by taking up water molecules, and consequently depletes the atmosphere of the interior space 12 of the component 1 of water molecules, so that electrolyte formation with residual halides is prevented. The core material 11 of a polybutylene terephthalate consequently has a gettering effect on the water molecules of the gas atmosphere of the interior space 12, so that it is possible to dispense with expensive alternative getter layers or the filling of such electronic components with noble gases.

Figure 2:
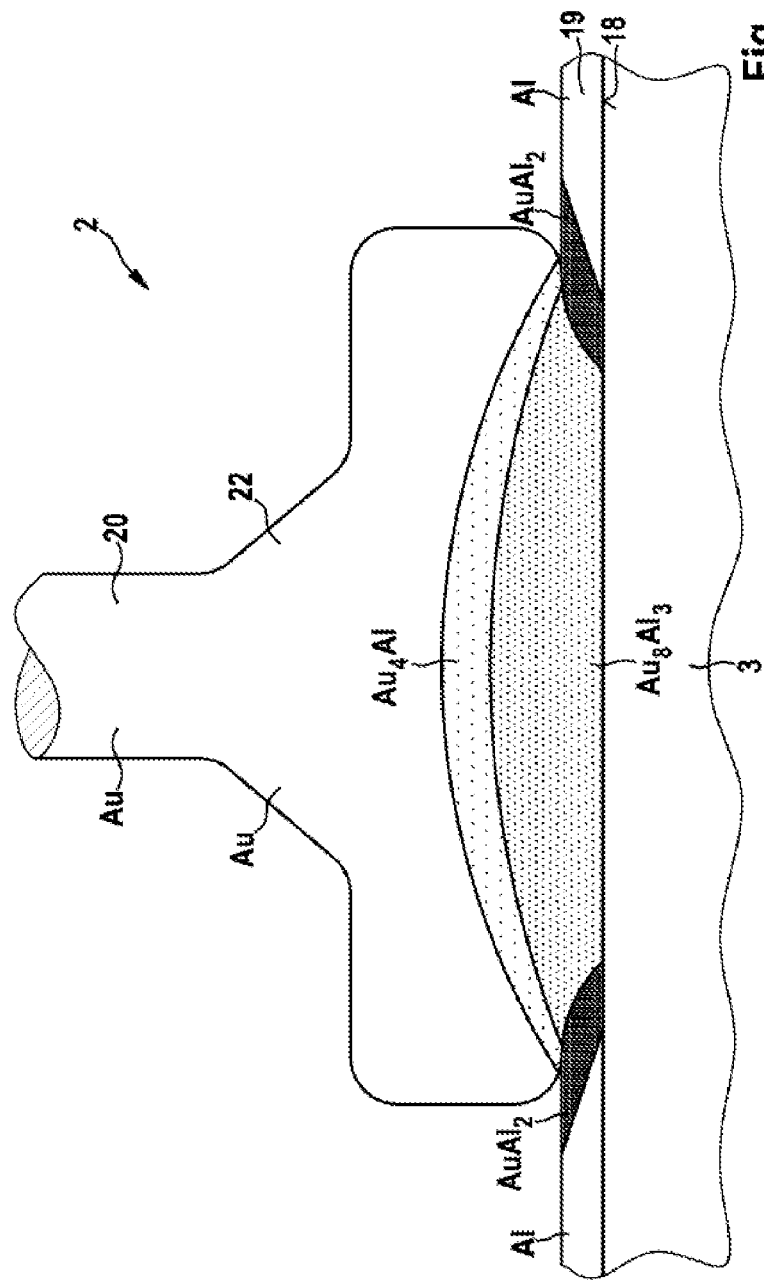
FIG. 2 shows a representation of intermetallic phases of a gold bonding wire connection on a semiconductor chip.

FIG. 2 shows a schematic representation of intermetallic phases of a thermocompression-bonded gold wire connection on an aluminum bonding area 19 of an upper side 18 of a semiconductor chip 3. In FIG. 2, firstly the typical nail head form 22 that is produced in thermocompression bonding can be seen, a round gold wire 20 with a diameter of between 12 and 50 micrometers being deformed into the typical nail head form 22 while it is being pressed onto the aluminum bonding area 19 on account of a blob of molten gold that is formed in the meantime and is suspended from the gold wire 20. For this reason, this bonding method is also known as "nail-head bonding". At the transition from the nail head form 22 to the aluminum bonding area 19, a first intermetallic phase of $Au_4Al$ is thereby produced, and thereunder a second intermetallic phase $Au_8Al_3$, which uses up almost the entire thickness of the aluminum bonding area. A third aluminum-rich intermetallic phase $AuAl_2$ forms in a ring around the nail head form 22 at the transition to the aluminum bonding area 19. This thermocompression-bonded bonding wire connection between a gold wire 20 and the aluminum bonding area 19 is at risk of corrosion, which is shown by FIG. 3.

Figure 3:
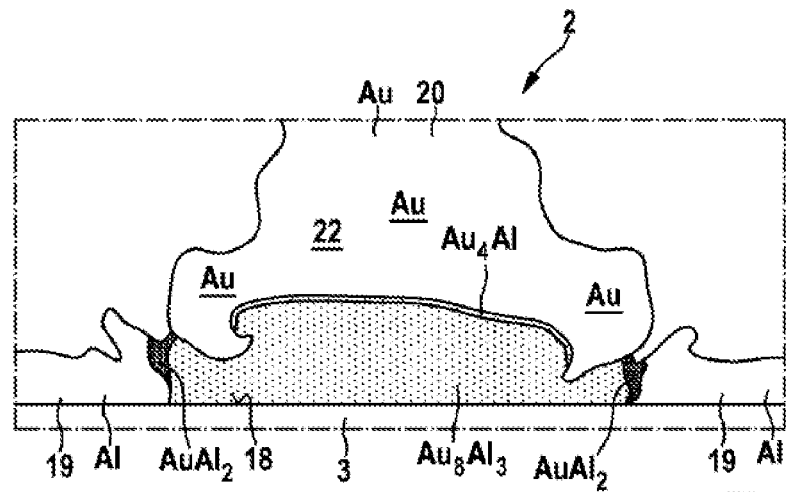
FIG. 3 shows a micrograph through a corrosion-affected, unprotected gold bonding wire connection with marking of the corroded intermetallic phases.

FIG. 3 shows a micrograph through a corrosion-affected, unprotected gold bonding wire connection 2 with marking of the corroded intermetallic phases. Not much remains of the nail head form 22 originally shown in FIG. 2; rather, it is fissured and, at least in the region on the left of FIG. 3, at the transition to the aluminum coating, already threatens to break. Such a corrosion process is dependent on the operating time, and limits this to a relatively short service life for the electronic component. The intermetallic first phase $Au_4Al$ at the transition from the nail head 22, made of gold, to the aluminum bonding area 19 can also be seen here, by the varyingly dark regions, and also present are the second intermetallic phase $Au_8Al_3$, directly on the silicon surface, as well as the aluminum-rich third metallic phase $AuAl_2$, surrounding the nail head 22.

Figure 4:
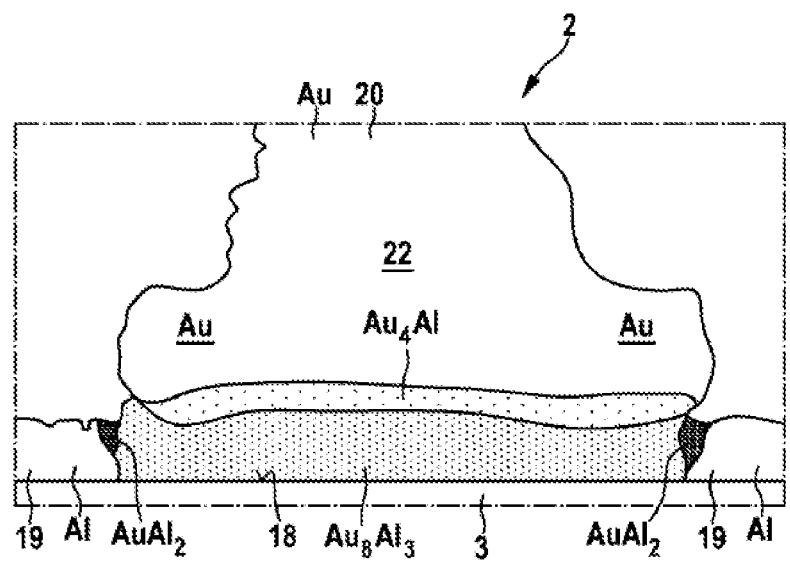
FIG. 4 shows a micrograph through a corrosion-protected gold bonding wire connection of the electronic component of the embodiment according to FIG. 1.

By contrast, FIG. 4 shows a micrograph through a corrosion-protected gold bonding wire connection 2 with marking of the intact intermetallic phase structure in an electronic component of the embodiment of the invention according to FIG. 1. Both the nail head contour in the transitional region from the gold wire 20 to the nail head 22 remains unchanged after a testing time ten times that used for obtaining the result in FIG. 3 and the other regions of the intermetallic gold aluminum phases are still completely intact on the aluminum bonding area 19.

The invention claimed is:

1. An electronic component having a corrosion-protected bonding connection, comprising:
at least one semiconductor chip (3) on a substrate (4);
at least one bonding connection at risk of corrosion on the semiconductor chip (3); and
a package (5) hermetically enclosing the at least one semiconductor chip (3) and the at least one bonding connection at risk of corrosion,
the bonding connection being a bonding wire connection (2), and the bonding wire connection (2) being completely hermetically enclosed in the package (5) and the substrate (4) being at least partially hermetically enclosed in the package (5), and at least one surface-mountable hydrolysis-sensitive component (6) being arranged on the substrate (4); wherein the hydrolysis-sensitive component (6) comprises a hydrolysis-sensitive core material (11), the core material (11) being able to getter water molecules of an atmosphere of an interior space (12) of the package (5); the core material (11) of the hydrolysis-sensitive component (6) having a semipermeable coating at least on an upper side (7) and a peripheral surface (9) of the hydrolysis-sensitive component (6), and the semipermeable coating supporting the form of the hydrolysis-sensitive component (6) during saponification and loss of form and is permeable to water molecules.

2. The electronic component as claimed in claim 1, the hydrolysis-sensitive component (6) having the upper side (7), an underside (8) and the peripheral surface (9) arranged between the upper side (7) and the underside (8), and the underside (8) of the hydrolysis-sensitive component (6) having a surface-mountable molecular layer (10).

3. The electronic component as claimed in claim 1, the hydrolysis-sensitive component (6) comprising a hydrolysis-sensitive plastic.

4. The electronic component as claimed in claim 3, the plastic comprising a hydrolysis-sensitive polymer, which in its hydrolysis extracts water molecules from the interior space (12) of the package (5).

5. The electronic component as claimed in claim 3, the hydrolysis-sensitive plastic being exposed to intensive saponification by hydrolysis when a glass transition temperature of the plastic is exceeded.

6. The electronic component as claimed in claim 3, the plastic being a hydrolysis-sensitive polyester.

7. The electronic component as claimed in claim 3, the plastic being a hydrolysis-sensitive polybutylene terephthalate.

8. A method for producing an electronic component (1) as claimed in claim 1, which comprises the following method steps:
producing at least one semiconductor chip (3);
applying the at least one semiconductor chip (3) to a substrate (4);
establishing at least one bonding wire connection (2) between the at least one semiconductor chip (3) and the substrate (4);
surface-mounting at least one component (6) with a hydrolysis-sensitive material on the substrate (4);
hermetically encapsulating the at least one semiconductor chip (3), the at least one bonding wire connection (2), the at least one component (6) with the hydrolysis-sensitive material and at least partially the substrate (4) in a package (5); and heat-treating the electronic component (1) at a temperature above a glass transition temperature of the hydrolysis-sensitive material, with gettering of water molecules of an atmosphere of an interior space (12) of the package (5); wherein the hydrolysis-sensitive component (6) comprises a hydrolysis-sensitive core material (11), the core material (11) of the hydrolysis-sensitive component (6) having a semipermeable coating at least on the upper side (7) and the peripheral surface (9) of the hydrolysis-sensitive component (6), and the semipermeable coating supporting the form of the hydrolysis-sensitive component (6) during saponification and loss of form and is permeable to water molecules.

* * * * *